United States Patent
Mayer et al.

(10) Patent No.: US 9,479,187 B2
(45) Date of Patent: Oct. 25, 2016

(54) PREDICTIVE TIME-TO-DIGITAL CONVERTER AND METHOD FOR PROVIDING A DIGITAL REPRESENTATION OF A TIME INTERVAL

(71) Applicant: Intel Corporation, Santa Clara, CA (US)

(72) Inventors: Thomas Mayer, Linz (AT); Stefan Tertinek, Linz (AT)

(73) Assignee: Intel Corporation, Santa Clara, CA (US)

( * ) Notice: Subject to any disclaimer, the term of this patent is extended or adjusted under 35 U.S.C. 154(b) by 24 days.

(21) Appl. No.: 14/568,588

(22) Filed: Dec. 12, 2014

(65) Prior Publication Data

US 2016/0173118 A1   Jun. 16, 2016

(51) Int. Cl.
  *H03M 1/12*     (2006.01)
  *H04L 7/00*     (2006.01)
  *H04L 5/00*     (2006.01)

(52) U.S. Cl.
  CPC .............. *H03M 1/12* (2013.01); *H04L 5/0048* (2013.01); *H04L 7/0037* (2013.01); *H04L 7/0045* (2013.01)

(58) Field of Classification Search
  CPC .... G04F 10/005; H03K 7/093; H03M 1/002; H03M 1/12; H04L 5/0048; H04L 7/0037; H04L 7/0045
  See application file for complete search history.

(56) References Cited

U.S. PATENT DOCUMENTS

| | | | |
|---|---|---|---|
| 5,204,678 A | 4/1993 | Foley | |
| 8,264,388 B1 | 9/2012 | Cohen et al. | |
| 2002/0158662 A1* | 10/2002 | Staszewski | H03K 19/0016 326/46 |
| 2006/0103566 A1 | 5/2006 | Vemulapalli et al. | |
| 2007/0222493 A1* | 9/2007 | Afentakis | H03K 5/133 327/276 |
| 2009/0028274 A1* | 1/2009 | Kim | G04F 10/06 375/340 |
| 2011/0084863 A1 | 4/2011 | Chiu et al. | |
| 2012/0062296 A1 | 3/2012 | Miyashita | |

(Continued)

FOREIGN PATENT DOCUMENTS

JP    5106583 B2    12/2012

OTHER PUBLICATIONS

"European Application Serial No. 15193964.2, Extended European Search Report mailed Apr. 26, 2016", 7 pgs.

*Primary Examiner* — David B Lugo
(74) *Attorney, Agent, or Firm* — Schwegman Lundberg & Woessner, P.A.

(57) ABSTRACT

Predictive time-to-digital converters (TDCs) and methods for providing a digital representation of a time interval are disclosed herein. In an example, a TDC can include a delay line, a selection circuit, and a latch circuit. The delay line can include a plurality of delay elements configured to propagate a first edge of a first signal sequentially through the plurality of delay elements. The selection circuit can be configured to receive the first signal, to receive prediction information, and to route the first signal to an input of one of the plurality of delay elements based on the prediction information. The latch circuit can receive a second signal and can latch a plurality of outputs of the delay line upon reception of a second edge of the second signal. An output of the latch circuit can provide an indication of a delay between the first edge and the second edge.

25 Claims, 5 Drawing Sheets

(56) References Cited

U.S. PATENT DOCUMENTS

| | | | | |
|---|---|---|---|---|
| 2013/0121094 A1* | 5/2013 | Zerbe | ............ | H03L 7/091 365/194 |
| 2014/0119099 A1* | 5/2014 | Clark | ............ | G11C 5/146 365/149 |
| 2014/0292552 A1 | 10/2014 | Kim et al. | | |
| 2015/0139358 A1* | 5/2015 | Asuri | ............ | H04L 27/361 375/297 |
| 2015/0188583 A1* | 7/2015 | Ravi | ............ | H04B 1/0475 375/296 |
| 2015/0263850 A1* | 9/2015 | Asada | ............ | H03L 7/08 375/371 |

* cited by examiner

PREDICTIVE TIME-TO-DIGITAL CONVERTER AND METHOD FOR PROVIDING A DIGITAL REPRESENTATION OF A TIME INTERVAL

TECHNICAL FIELD

The present subject matter generally relates to communication architectures and, in particular, to apparatus and methods for a time-to-digital converter of a transmitter, a receiver or a transceiver. Some examples relate to phase-locked loops. Some examples relate to transmitters suitable for use in transmitting orthogonal frequency division multiplexing (OFDM) signals including orthogonal frequency division multiple access (OFDMA) signals in accordance with some of the 3rd Generation Partnership Project (3GPP) long-term evolution (LTE) standards.

BACKGROUND

Digital transceiver architectures are very attractive for modern radios because they can provide improved area and power consumption characteristics compared with conventional analog architectures. For example, highly digitized transceiver processing circuits for switched signals can be implemented much better in small scale CMOS processes compared to their analog counterparts. Time-to-digital converters (TDCs) are often implemented in digital transmitter circuits to convert analog time domain information into information appropriate for the digital processing domain. For example, TDCs can be employed in phase lock loops (PLLs) to measure phase error or in local oscillator generation to calibrate other time domain digital processing circuits such as digital-to-time converters (DTCs). In general, a TDC can provide a measurement mechanism or circuit to receive first and second events and to provide a digital representation of the time interval between the two events. TDCs that offer high resolution and low power consumption are preferred components for present digital signal processing circuits, such as digital transmitters, digital receivers and digital transceivers.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
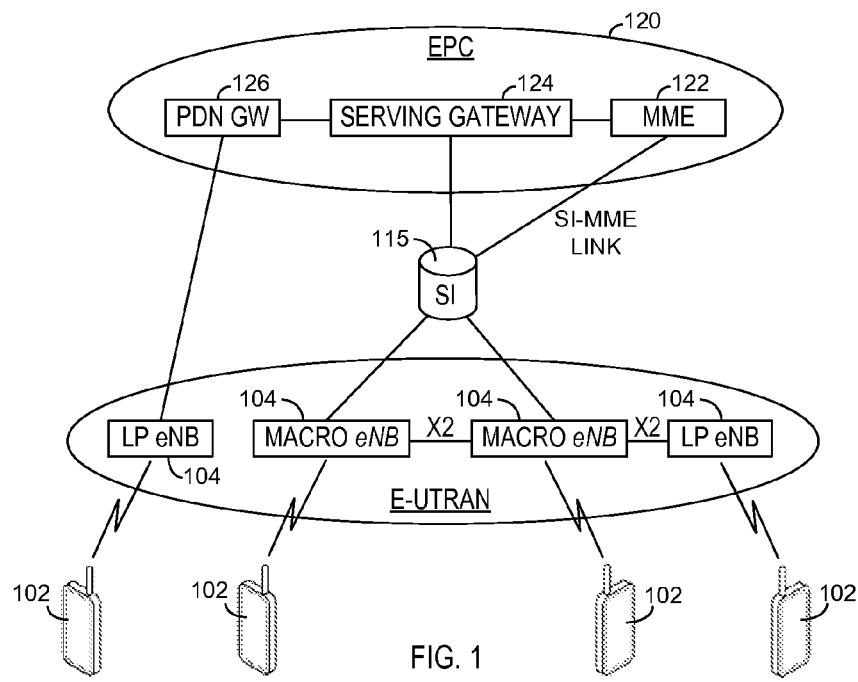
FIG. 1 shows a portion of an end-to-end network architecture of LTE (long term evolution) network with various components of the network in accordance with some examples of the present subject matter.

FIG. 1 shows a portion of an end-to-end network architecture of LTE (long term evolution) network with various components of the network in accordance with some embodiments. The network comprises a radio access network (RAN) (e.g., as depicted, the E-UTRAN or evolved universal terrestrial radio access network) and the core network (EPC) 120 coupled together through an S1 interface 115. Note that for convenience and brevity sake, only a portion of the core network, as well as the RAN, is shown.

The core (EPC) 120 includes mobility management entity (MME) 122, serving gateway (serving GW) 124, and packet data network gateway (PDN GW) 126. The RAN includes enhanced node B's (eNBs) 104 (which may operate as base stations) for communicating with user equipment (UE) 102. The eNBs 104 may include macro eNBs and low power (LP) eNBs.

The MME is similar in function to the control plane of legacy Serving GPRS Support Nodes (SGSN). It manages mobility aspects in access such as gateway selection and tracking area list management. The serving GW 124 terminates the interface toward the RAN, and routes data packets between the RAN and core network. In addition, it may be a local mobility anchor point for inter-eNode-B handovers and also may provide an anchor for inter-3GPP mobility. Other responsibilities may include lawful intercept, charging, and some policy enforcement. The Serving GW and the MME may be implemented in one physical node or separate physical nodes. The PDN GW terminates a SGi interface toward the packet data network (PDN). It routes data packets between the EPC and the external PDN, and may be a key node for policy enforcement and charging data collection. It may also provide an anchor point for mobility with non-LTE accesses. The external PDN can be any kind of IP network, as well as an IP Multimedia Subsystem (IMS) domain. The PDN GW and the Serving GW may be implemented in one physical node or separated physical nodes.

The eNode-B 104 (macro and micro) terminates the air interface protocol and is usually (if not always) the first point of contact for a UE 102. In some embodiments, an eNode-B 104 may fulfill various logical functions for the RAN including but not limited to RNC (radio network controller functions) such as radio bearer management, uplink and downlink dynamic radio resource management and data packet scheduling, and mobility management.

The S1 interface is the interface that separates the RAN and the EPC. It is split into two parts: the S1-U, which carries traffic data between the eNode-B and the Serving GW, and the S1-MME, which is a signaling interface between the eNode-B and the MME. The X2 interface is the interface between eNode-Bs (at least between most, as will be addressed below regarding micro eNBs). The X2 interface comprises two parts, the X2-C and X2-U. The X2-C is the control plane interface between eNode-Bs, while the X2-U is the user plane interface between eNode-Bs.

With cellular networks, LP cells are typically used to extend coverage to indoor areas where outdoor signals do not reach well, or to add network capacity in areas with very dense phone usage, such as train stations. As used herein, the term low power (LP) eNB refers to any suitable relatively low power eNode-B for implementing a narrower cell (narrower than a macro cell) such as a femtocell, a picocell, or a micro cell. Femtocell eNBs are typically provided by a mobile network operator to its residential or enterprise customers. A femtocell is typically the size of a residential gateway or smaller and generally connects to the user's broadband line. Once plugged in, the femtocell connects to the mobile operator's mobile network and provides extra coverage in a range of typically 30 to 50 meters for residential femtocells. Thus, a LP eNB might be a femtocell eNB since it is coupled through the PDN GW 126. Similarly, a picocell is a wireless communication system typically covering a small area, such as in-building (offices, shopping malls, train stations, etc.), or more recently in-aircraft. A picocell eNB can generally connect through the X2 link to another eNB such as a macro eNB through its base station controller (BSC) functionality. Thus, LP eNB 106 could be implemented with a picocell eNB since it is coupled to a macro eNB via an X2 interface. Picocell eNBs or other LP eNBs for that matter) may incorporate some or all functionality of a macro eNB. In some cases, this may be referred to as an access point base station or enterprise femtocell.

Digital polar circuits are very attractive for modern radios because such architectures can provide improved area and power consumption characteristics compared with conventional analog architectures. In accordance with some embodiments, a UE 102 or an eNB 104 may include a digital polar transmitter and or receiver which can include one or more phase-locked loops (PLLs), one or more digital-to-time converters (DTCs), and one or more TDCs. In these embodiments, the TDCs can be used to calibrate and compensate the PLLs and DTCs. In certain examples, a TDC can include a multiplexer, delay line and a latch circuit. The multiplexer can pass a first signal to one of a plurality of delay elements of the delay line based on prediction information such that some of the delay elements of the delay line can be low-resolution, or coarse delay elements that can allow the DTC to be smaller and use less power while maintain high resolution. These embodiments are discussed in more detail below.

Figure 2:
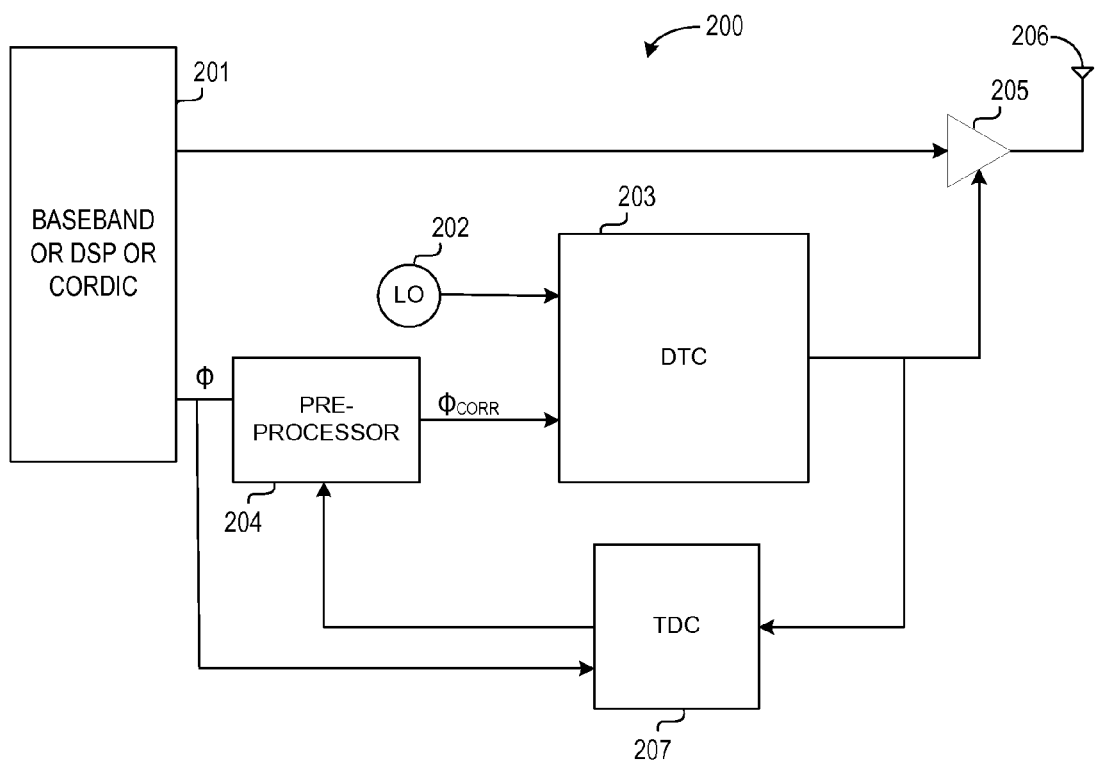
FIG. 2 illustrates generally a communication circuit and more particularly a digital polar transmitter according to various examples of the present subject matter.

FIG. 2 illustrates generally a communication circuit and more particularly a digital polar transmitter 200 according to various examples of the present subject matter. The illustrated circuit is shown for an example transmitter radio circuit. It is understood that polar communication architectures can also be employed in receiver radio circuits or in combination transceiver circuits including both a transmitter and a receiver. In certain examples, the transmitter 200 can include a processor 201, a local oscillator 202, a DTC 203, an optional preprocessor 204 for the DTC 203, a time-to-digital-converter 207, a power amplifier 205, and one or more antennas 206. In some examples, such as multi-input, multi-output (MIMO) devices, two or more antennas may be used. In certain examples, the processor 201 can include a baseband processor such as for a mobile electronic device, a digital signal processor (DSP) or a Cordic converter for providing amplitude and phase modulation information representative of digital transmission data. In certain examples, some known non-linearity of the DTC 203 can be compensated for using the preprocessor 204. In some examples, the preprocessor 204 can receive phase modulation information from the processor 201. In some examples, the preprocessor 204 can receive phase ramp information ($\psi$) for providing a desired radio frequency. In certain examples, the preprocessor 204 can adjust or correct the received processor information to provide corrected information ($\psi_{CORR}$) to compensate for at least some of the non-linearity of the DTC 203. In certain examples, the DTC 203 can receive reference clock information from the local oscillator 202 and the corrected processor information ($\psi_{CORR}$) from the preprocessor 204. The DTC 203 can provide an output signal ($DTC_{OUT}$) at a desired frequency using the local oscillator 202 and the corrected processor information ($\psi_{CORR}$). For transmitter examples, the power amplifier 205 can mix the output signal ($DTC_{OUT}$) with amplitude information to provide a transmission signal. The one or more antenna 206 can broadcast the transmission signal for reception by a second device.

In certain receiver examples, a DTC can be used to modulate reference frequency and phase information to provide a suitable signal for demodulating data from a received radio frequency signal for example using a demodulator. In certain examples, a transmitter or receiver circuit can include one or more TDCs and can be used to calibrate and compensate various digital components. A TDC can provide very precise time measurement, such as a measurement of time between signal transitions. Such measurements can be useful for finding nonlinearities in digital communication components such as the local oscillator 202 or the DTC 203. Upon measuring an interval of interest, a controller, such as a configuration or calibration controller (not shown) can provide pre-distortion information for compensating the identified non-linearity. In some examples, the TDC can measure signal transitions of the DTC and a calibration controller can provide relevant pre-distortion information to the preprocessor to compensate for nonlinearities. In some examples, a TDC can be used to measure non-linearity of phased-lock loops, such as a local, PLL-based oscillator providing reference information to the DTC.

In some embodiments, the transceiver 200 (FIG. 2) may be part of a portable wireless communication device, such as a personal digital assistant (PDA), a laptop or portable computer with wireless communication capability, a web tablet, a wireless telephone, a smartphone, a wireless headset, a pager, an instant messaging device, a digital camera, an access point, a television, a medical device (e.g., a heart rate monitor, a blood pressure monitor, etc.), or other device that may receive and/or transmit information wirelessly. In some embodiments, the mobile device may include one or more of a keyboard, a display, a non-volatile memory port, multiple antennas, a graphics processor, an application processor, speakers, and other mobile device elements. The display may be an LCD screen including a touch screen.

The antennas may comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) embodiments, the antennas may be effectively separated to take advantage of spatial diversity and the different channel characteristics that may result.

Although the transmitter 200 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements may refer to one or more processes operating on one or more processing elements.

Embodiments may be implemented in one or a combination of hardware, firmware and software. Embodiments may also be implemented as instructions stored on a computer-readable storage medium, which may be read and executed by at least one processor to perform the operations described herein. A computer-readable storage medium may include any non-transitory mechanism for storing information in a form readable by a machine (e.g., a computer). For example, a computer-readable storage medium may include read-only memory (ROM), random-access memory (RAM), magnetic disk storage media, optical storage media, flash-memory devices, and other storage devices and media. In these embodiments, one or more processors may be configured with the instructions to perform the operations described herein.

In some examples, the transceiver 200 may be part of a UE or eNB (FIG. 1) and may be configured to transmit and/or receive orthogonal frequency division multiplexing (OFDM) communication signals over a multicarrier communication channel in accordance with an orthogonal frequency division multiple access (OFDMA) communication technique. The OFDM signals may comprise a plurality of orthogonal subcarriers. In some broadband multicarrier embodiments, the UEs and eNBs may be part of a cellular broadband wireless access (BWA) network communication network, such a 3rd Generation Partnership Project (3GPP) Universal Terrestrial Radio Access Network (UTRAN) Long-Term-Evolution (LTE) or a Long-Term-Evolution (LTE) communication network, although the scope of the present subject matter is not limited in this respect. In these broadband multicarrier embodiments, the UEs and the eNBs may be configured to communicate in accordance with an OFDMA technique.

Figure 3:
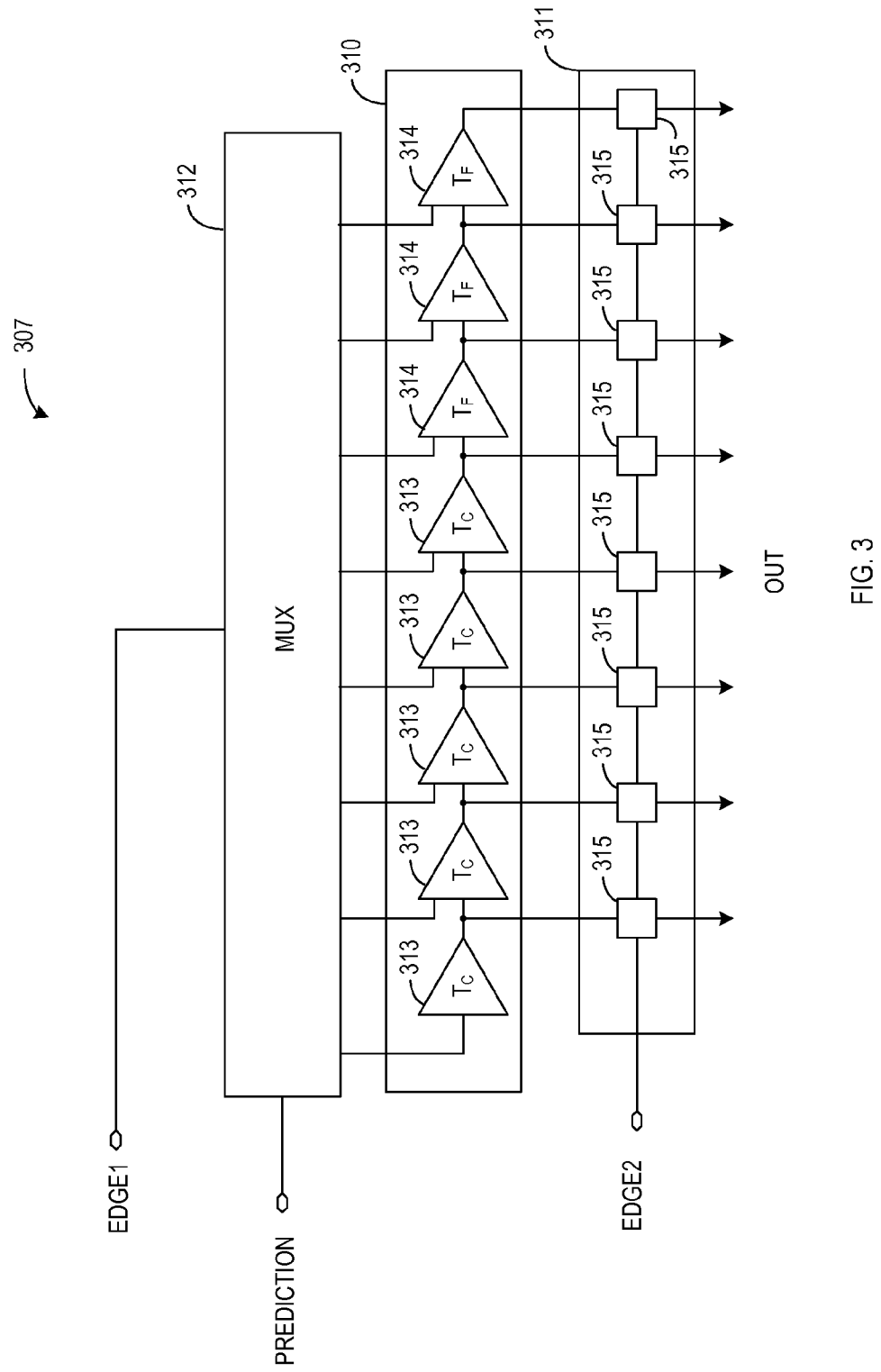
FIG. 3 illustrates generally a time-to-digital converter (TDC) according to various examples of the present subject matter.

FIG. 3 illustrates generally a TDC 307 according to various examples of the present subject matter. TDC 307 may be suitable for use in various communication devices such as a UE or eNB as illustrated in FIG. 1. In an example, the TDC 307 can include a delay line 310, a latch circuit 311 and a multiplexer circuit (MUX) 312. In certain examples, the delay line 310 can include a number of delay elements 313, 314. Upon reception of a first transition of a signal at a first input (EDGE1) of the TDC 207, the edge can propagate sequentially through each delay element 313, 314 such that output of each delay element 313, 314 can transition a delay interval ($T_C$ or $T_F$) after receiving the transition at the input of the delay element 313, 314. Unlike traditional TDCs, the example delay line 310 can include a mix of coarse delay elements 313 having a coarse delay interval ($T_C$) and fine delay elements 314 having a fine delay interval ($T_F$). In certain examples, the fine delay interval ($T_F$) of the fine delay elements 314 can establish the resolution of the TDC 307. As will be discussed again below, the combination of coarse and fine delay elements 313, 314 can allow the TDC 207 to be smaller than traditional TDCs while maintaining the same or better time measurement resolution.

In certain examples, the latch circuit 311 can include a number of latch elements 315 such as, but not limited to, a number of flip-flops. In general, a latch element 315 can be coupled to and can receive the output of one of the delay elements 313, 314 of the delay line 310. Upon receiving a trigger, the latch elements 315 can provide, and hold at an output, the state of the delay element output at the instant of the trigger. In certain examples, the trigger can be a second transition of a signal at an input (EDGE2) to the latch circuit 311. In certain examples, the input (EDGE2) to the latch circuit 311 can be coupled in parallel to the trigger input of each latch element 315. Upon latching the latch circuit 311, the output (OUT) of the latch circuit 311 can provide a digital representation of the time interval between reception of the first transition and the second transition.

In certain examples, the MUX 312 can couple the first input (EDGE1) of the TDC 201 with an input of one of the delay elements 313, 314 of the delay line 310 based on selection information received at an input (PREDICTION) of the MUX 312. In many cases, the interval between the transitions being measured by the TDC 207 can be predicted within a limited range unless there is some kind of anomaly. The MUX 312 allows the first input to be coupled to a particular delay element of the delay line such that the transition of interest can be propagating through one of the fine delay elements 314 when the transition is received at the second input of the TDC 207, or as discussed above, the input (EDGE2) to the latch circuit 311. In certain examples, the limited range of the predicted interval can be a basis of the selection information received at the input (PREDICTION) of the MUX 312. As discussed briefly above, the MUX 312 and selection information can allow the TDC 307 to be made with less delay elements than existing TDCs while being able to measure the same intervals with the same resolution as existing TDCs. In accordance with some embodiments, TDCs disclosed herein may use fewer coarse delay elements and may be more energy efficient than conventional TDCs. Also, the fully digital TDC 307 can provide improved chip area utilization and can be implemented via small scale CMOS processes, in certain examples.

Figure 4:
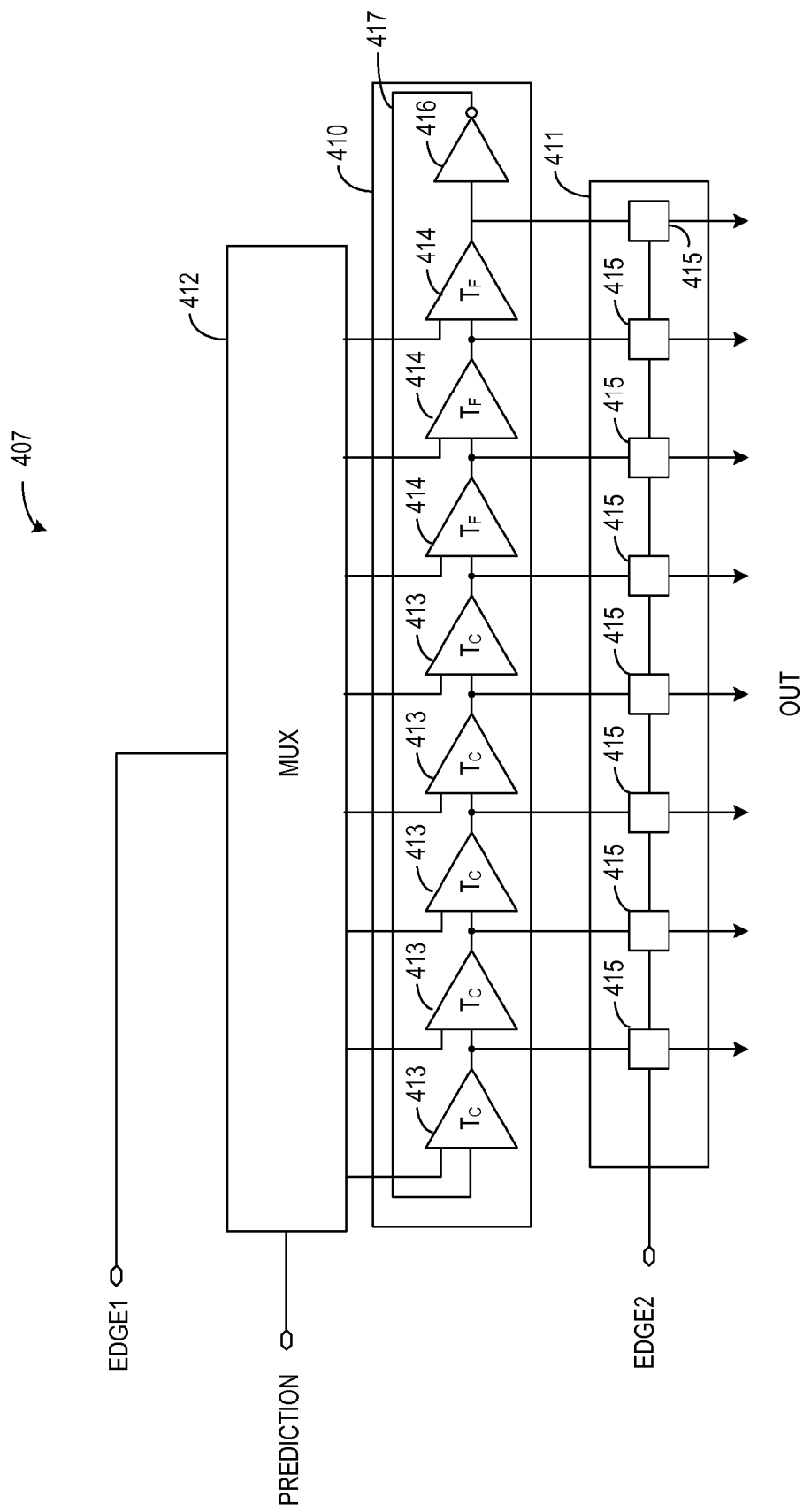
FIG. 4 illustrates generally a TDC with a recycle path according to various examples of the present subject matter.

FIG. 4 illustrates generally a TDC according to various examples of the present subject matter. TDC 407 may be suitable for use in various communication devices such as a UE or eNB as illustrated in FIG. 1. In an example, the TDC 407 can include a delay line 410, a latch circuit 411 and a multiplexer circuit (MUX) 412. In certain examples, the delay line 410 can include a number of delay elements 413, 414. Upon reception of a first transition of a signal at a first input (EDGE1) of the TDC 407, the transition can propagate sequentially through each delay element 413, 414 such that output of each delay element 413, 414 can transition a delay interval ($T_C$ or $T_F$) after receiving the transition at the input of the delay element 413, 414. The example delay line 410 can include a mix of coarse delay elements 413 having a coarse delay interval ($T_C$) and fine delay elements 214 having a fine delay interval ($T_F$). In certain examples, the fine delay interval ($T_F$) of the fine delay elements 414 can establish the resolution of the TDC 407. The combination of coarse and fine delay elements 413, 414 can allow the TDC 407 to be smaller than traditional TDCs while maintaining the same or better time measurement resolution.

In certain examples, the latch circuit 411 can include a number of latch elements 415 such as, but not limited to, a number of flip-flops. In general, a latch element 415 can be coupled to and can receive the output of one of the delay elements 413, 414 of the delay line 410. Upon receiving a trigger, the latch elements 415 can provide, and hold at an output, the state of the delay element output at the instant of the trigger. In certain examples, the trigger can be a second transition of a signal at an input (EDGE2) to the latch circuit 411. In certain examples, the input (EDGE2) to the latch circuit 411 can be coupled in parallel to the trigger input of each latch element 415. Upon latching the latch circuit 411, the output (OUT) of the latch circuit 411 can provide a digital representation of the time interval between reception of the first transition and the second transition.

In certain examples, the MUX 412 can couple the first input (EDGE1) of the TDC 407 with an input of one of the delay elements 413, 414 of the delay line 410 based on selection information received at an input (PREDICTION) of the MUX 412. In many cases, the interval between the transitions being measured by the TDC 407 can be predicted within a limited range unless there is some kind of anomaly. The MUX 412 allows the first input to be coupled to a particular delay element of the delay line such that the transition of interest can be propagating through one of the fine delay elements 414 when the transition is received at the second input of the TDC 407, or as discussed above, the input (EDGE2) to the latch circuit 411. In certain examples, the limited range of the predicted interval can be a basis of the selection information received at the input (PREDICTION) of the MUX 412.

In certain examples, the delay line 410 can include a buffer, such as an inverter 416 at a downstream end of the delay line 410. The output of the buffer or inverter 416 can be coupled to the upstream end of the delay line 410 to provide a recycle path 417. Having the downstream end of delay line can recycle a the first input (EDGE1) can extend the total measurement range of the TDC as now the first transition can be allowed to propagate more than once through one or more of the delay elements 413, 414 before the second transition is received. In certain examples, where the prediction or selection information is sufficiently trusted, the number of cycles of a propagated transition completes through the delay line does not need to be monitored. In some examples, the TDC 407 can include optional circuitry to verify accuracy of the prediction or selection information by monitoring or providing status information associated with, for example, the number of times the first transition propagated through the downstream end of the delay line 410 or other point within the delay line 410. The MUX 412 and selection information and recycle path of the delay line 410 can allow the TDC 407 be made with less delay elements than existing TDCs while being able to measure the comparatively larger time intervals with the same resolution as traditional TDCs with a comparable number of delay elements. Also, the fully digital TDC 407 can provide improved circuit area utilization and can be implemented via small scale CMOS processes, in certain examples.

Figure 5:
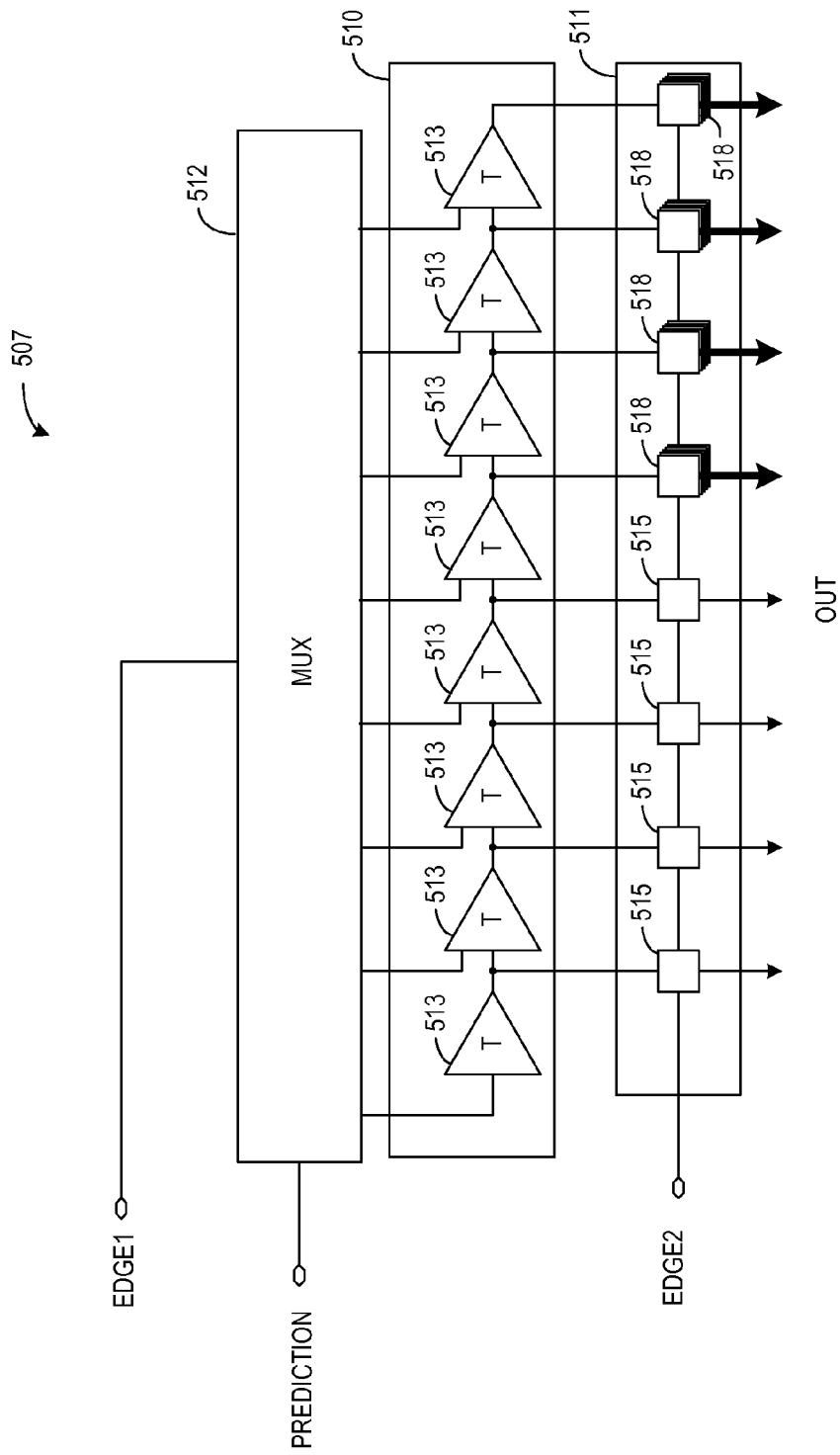
FIG. 5 illustrates generally a TDC including parallel latch elements according to various examples of the present subject matter.

FIG. 5 illustrates generally a TDC 507 according to various examples of the present subject matter. In an example, the TDC 507 can include a delay line 510, a latch circuit 511 and a multiplexer circuit (MUX) 512. In certain examples, the delay line 510 can include a number of delay elements 513, each having approximately the same delay interval (T). In certain examples, the delay elements can be lower resolution delay elements which typically are less complex and consume less energy than higher resolution delay elements. Upon reception of a first transition of a signal at a first input (EDGE1) of the TDC 507, the transition can propagate sequentially through each delay element 513 such that output of each delay element 513, 514 can transition a delay interval (T) after receiving the transition at the input of the delay element 513.

In certain examples, the MUX 512 can couple the first input (EDGE1) of the TDC 507 with an input of one of the delay elements 513, 514 of the delay line 510 based on selection information received at an input (PREDICTION) of the MUX 512. In many cases, the interval between the transitions being measured by the TDC 507 can be predicted within a limited range unless there is some kind of anomaly. The MUX 512 allows the first TDC input (PREDICTION) to be coupled to a particular delay element of the delay line such that the transition of interest can be propagating through a high resolution latch element 518 when the transition is received at the second TDC input (EDGE2), or as discussed above, the input (EDGE2) to the latch circuit 511. In certain examples, the anticipated range of the predicted interval can be a basis of the selection information received at the input (PREDICTION) of the MUX 512.

In certain examples, the latch circuit 511 can include number of latches 515, 518 such as, but not limited to, a number of flip-flops. In general, a latch 515, 518 can be coupled to and can receive the output of one of the delay elements 513 of the delay line 510. Upon receiving a trigger, some of the latch 515 can provide, and hold at an output, the state of the delay element output at the instant of the trigger. In certain examples, the latch circuit 511 can include one or more high resolution latch elements 518. In some examples, the high resolution latch can include a number of sub-latch circuits coupled in parallel with an output of a particular delay element 513 of the delay line 510. Each the sub-latch circuit that makes up a high-resolution latch can have a latch delay. In certain examples, a plurality of sub-latch elements for a particular high resolution latch element 518 can be arranged to provide sequential latch delays that can span the delay interval (T) of a delay element 513 of the delay line 510. In certain examples, each sub-latch elements of a high resolution latch element includes a different latch delay and the resolution of the TDC 507 can be derived from the latch delay difference between two sequential sub-latch elements.

In certain examples, the trigger for the latch circuit 511 can be a second transition of a signal at an input (EDGE2) to the latch circuit 511. In certain examples, the input (EDGE2) to the latch circuit 511 can be coupled in parallel to the trigger input of each latch element 515 and each high-resolution latch element 518. Upon triggering the latch circuit 511, the output (OUT) of the latch circuit 511 can provide a digital representation of the time interval between reception of the first transition and reception of the second transition at the TDC 507. In certain examples, the output (OUT) of the TDC 507 can include multiple bits from each high-resolution latch element 518, the multiple bits indicative of a state of each of the sub-latch elements of the high-resolution latch element 518. In certain examples, the delay line 510 of FIG. 4 can include a buffer and recycle path as shown in FIG. 3 such that the measurable range of the TDC can be extended. As with the previously discussed examples, the fully digital TDC 507 can provide improved circuit area utilization and can be implemented via small scale CMOS processes, in certain examples. TDC 507 may be suitable for use in various communication devices such as a UE or eNB as illustrated in FIG. 1.

Figure 6:
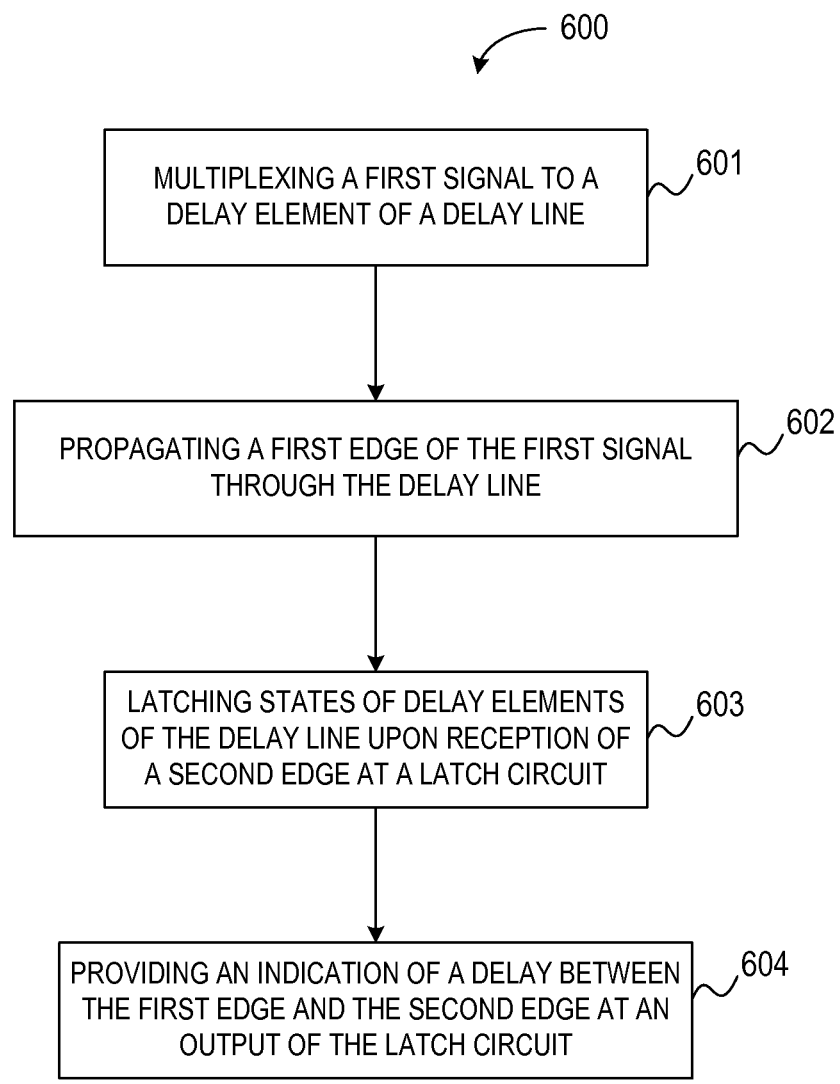
FIG. 6 illustrates generally a flowchart of a method of operating a TDC according to various examples of the present subject matter.

FIG. 6 illustrates generally a flowchart of a method 600 of operating a TDC according to various examples of the present subject matter. Method 600 may be performed by a TDC, such as the example TDCs of FIGS. 3-5, although the scope of the example method is not limited in this respect. At 601, a first signal can be received at a multiplexer and multiplexed to an input of a particular delay element of a delay line of a TDC. In certain examples, the multiplexer can select the input of the particular delay element based on prediction or selection information received or transmitted to the multiplexer. At 602, a first edge or transition of the signal can be propagated through the delay line. In some examples, the delay line can include a recycle path to pass a propagating edge from an output of a distal or last delay element of the delay to the input of a proximal or first delay element of the delay line. In some examples, the recycle path can include a buffer or inverter. At 603, output states of the delay elements of the delay line can be latched in a latch circuit upon reception of a second edge of a signal received at the latch circuit. At 604, the method 600 can provide, at an output of the latch circuit, an indication of a delay interval between the first edge and the second edge. In certain examples, the delay interval can be a measurement of the time difference between reception of the first edge at the multiplexer of the TDC and the reception of the second edge at the latch of the TDC.

EXAMPLES AND ADDITIONAL NOTES

In Example 1, a time-to-digital converter (TDC) can include a delay line, a selection circuit and a latch circuit. The delay line can include a first plurality of delay elements configured to propagate a first edge of a first signal sequentially through the first plurality of delay elements. The selection circuit can be configured to receive the first signal, to receive prediction information, and to route the first signal to an input of one of the plurality of delay elements based on the prediction information. The latch circuit can be configured to receive a second signal and to latch a plurality of outputs of the delay line upon reception of a second edge of the second signal, wherein an output of the latch circuit provides an indication of a delay between the first edge and the second edge.

In Example 2, the plurality of delay elements of Example 1 optionally includes a coarse delay element having a coarse delay interval and a first fine delay element having a fine delay interval, and wherein the coarse delay interval has a duration that is at least twice as long as the fine delay interval.

In Example 3, an input of the first fine delay element of any one or more of Examples 1-2 optionally is configured to couple with an output of the coarse delay element.

In Example 4, an input of the coarse delay element of any one or more of Examples 1-3 optionally is configured to receive the first edge.

In Example 5, the TDC of any one or more of Examples 1-4 optionally includes a second fine delay element configured to receive an output of the first fine delay element, and an input of the coarse delay element of any one or more of Examples 1-4 optionally is coupled to the output of the second fine delay element.

In Example 6, the output of the latch circuit of any one or more of Examples 1-5 optionally is configured to provide a representation of an output state of each delay element of a second plurality of delay elements of the first plurality of delay elements at the time the second edge is received at the latch.

In Example 7, the latch circuit of any one or more of Examples 1-6 optionally includes a plurality of latches, wherein each latch is coupled to an output of one of the delay elements of the first plurality of delay elements, and wherein the output of the latch circuit includes an output of each latch of the plurality of latches.

In Example 8, the latch circuit of any one or more of Examples 1-7 optionally includes a high-resolution latch, the high resolution latch including a plurality of sub-latch circuits, the high resolution latch configured to receive an output of a single delay element of the plurality of delay elements and to provide a plurality of high-resolution outputs, wherein each sub-latch circuit of the plurality of sub-latch circuits includes a different latch delay.

In Example 9, the TDC of any one or more of Examples 1-8 optionally includes a recycle path configured to provide an output signal of a downstream delay element of the delay line to an upstream delay element of the delay line.

In Example 10, the recycle path of any one or more of Examples 1-9 optionally includes a buffer having an buffer input coupled to an output of the downstream delay element and a buffer output coupled to an input of the upstream delay element.

In Example 11, the buffer of any one or more of Examples 1-10 optionally includes an inverter.

In Example 12, a method of providing a digital representation of a time interval can include multiplexing a first signal to an input of a delay element of a plurality of sequentially connected delay elements of a delay line based on prediction information received at a multiplexer, propagating in a sequential manner the first edge of a first signal through a remaining plurality of sequentially connected delay elements of the plurality of sequentially connected delay elements, latching a plurality of output states of the plurality of sequentially connected delay elements at a latch circuit upon reception of a second edge of a second signal at the latch circuit, and providing an indication of a delay between the first edge and the second edge using an output of the latch circuit.

In Example 13, the propagating in a sequential manner the first edge of a first signal through a remaining plurality of sequentially connected delay elements of the a plurality of sequentially connected delay elements of any one or more of Examples 1-12 optionally includes propagating the first edge sequentially through a coarse delay element having a coarse delay interval and through a fine delay element having a fine delay interval, and the coarse delay interval of any one or more of Examples 1-12 optionally has a duration that is at least twice as long as the fine delay interval.

In Example 14, the propagating the first edge sequentially through a coarse delay element having a coarse delay interval and through a fine delay element having a fine delay interval of any one or more of Examples 1-13 optionally includes propagating the first edge through the coarse delay element to provide a first delayed representation of the first edge, and propagating the first delayed representation of the first edge through the fine delay element.

In Example 15, the method of any one or more of Examples 1-14 optionally includes receiving a second delayed representation of the first edge at a second fine delay element located at a distal end of the delay line, propagating the second delayed representation of the first edge through the second fine delay element to provide a first cycle-delayed representation of the first edge, and receiving the first cycle-delayed representation of the first edge at a first coarse delay element of the plurality of delay elements, the first coarse delay element located at a proximal end of the delay line.

In Example 16, the latching of any one or more of Examples 1-16 optionally includes latching outputs of a plurality of latches of the latch circuit, wherein each latch is coupled to an output of one of the delay elements of the first plurality of delay elements.

In Example 17, the latching of any one or more of Examples 1-16 optionally includes latching a plurality of outputs of a high resolution latch, the high resolution latch coupled to an output of a second one of the delay elements of the first plurality of delay elements.

In Example 18, the propagating in a sequential manner the first edge of a first signal through a remaining plurality of sequentially connected delay elements of the plurality of sequentially connected delay elements of any one or more of Examples 1-17 optionally includes recycling the first edge to an upstream delay element of the plurality of sequentially connected delay elements.

In Example 19, the method of any one or more of Examples 1-2 optionally includes buffering an output of a downstream delay element of the plurality of sequentially connected delay elements before the recycling of the first edge.

In Example 20, the buffering an output of a downstream delay element of any one or more of Examples 1-19 optionally includes inverting the output of the downstream delay element.

In Example 21, a communication device such as a transmitter, a receiver, or a combination thereof can include a reference generator configured to provide reference frequency and phase information, a digital-to-time converter (DTC) configured to receive the reference frequency and phase information, to receive phase modulation information from a baseband processor, and to provide a phase modulated signal, and a time-to-digital converter (TDC) configured to provide compensation information for either the reference generator or the DTC. The TDC can include a delay line including a first plurality of delay elements configured to propagate a first edge of a first signal sequentially through the first plurality of delay elements, a selection circuit configured to receive the first signal, to receive prediction information, and to route the first signal to an input of one of the plurality of delay elements based on the prediction information, and a latch circuit configured to receive a second signal and to latch a plurality of outputs of the delay line upon reception of a second edge of the second signal, wherein an output of the latch circuit provides an indication of a delay between the first edge and the second edge.

In Example 22, the communication device of any one or more of Examples 1-21 optionally includes an amplifier configured to receive the phase modulated signal and a corresponding amplitude signal and to provide a radio frequency signal.

In Example 23, the communication device of any one or more of Examples 1-22 optionally includes one or more antenna coupled to the amplifier.

In Example 24, the communication device of any one or more of Examples 1-23 optionally includes a demodulator configured to receive a radio frequency signal from the antenna and to provide a data signal representative of data demodulated from the radio signal using the filtered phase signal.

In Example 25, the communication device of any one or more of Examples 1-24 optionally is configured for transmission of OFDMA signals, and wherein the transmitter is configured to operate as part of user equipment (UE).

Example 26 can include, or can optionally be combined with any portion or combination of any portions of any one or more of Examples 1 through 25 to include, subject matter that can include means for performing any one or more of the functions of Examples 1 through 25, or a machine-readable medium including instructions that, when performed by a machine, cause the machine to perform any one or more of the functions of Examples 1 through 25.

The above detailed description includes references to the accompanying drawings, which form a part of the detailed description. The drawings show, by way of illustration, specific embodiments in which the present subject matter can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the present subject matter should be determined with reference to the appended claims, along with the full scope of equivalents to which such claims are entitled.

What is claimed is:

1. A time-to-digital converter (TDC) comprising:
    a delay line including a plurality of delay elements configured to propagate a first edge of a first signal sequentially through the plurality of delay elements;
    a selection circuit having a plurality of outputs, each output of the plurality of outputs individually coupled to an input of each delay element of the plurality of delay elements, the selection circuit configured to receive the first signal, to receive prediction information, and to route the first signal to an input of one of the plurality of delay elements via a corresponding, individually-coupled output of the plurality of outputs of the selection circuit based on the prediction information; and
    a latch circuit configured to receive a second signal and to latch a plurality of outputs of the delay line upon reception of a second edge of the second signal, and output an indication of a delay between the first edge and the second edge.

2. The TDC of claim 1, wherein the plurality of delay elements include a coarse delay element having a coarse delay interval and a first fine delay element having a fine delay interval, and wherein the coarse delay interval has a duration that is at least twice as long as the fine delay interval.

3. The TDC of claim 2, wherein an input of the first fine delay element is configured to couple with an output of the coarse delay element.

4. The TDC of claim 2, wherein an input of the coarse delay element is configured to receive the first edge.

5. The TDC of claim 2, including a second fine delay element configured to receive an output of the first fine delay element; and
wherein an input of the coarse delay element is coupled to the output of the second fine delay element.

6. The TDC of claim 1, wherein the output of the latch circuit is configured to provide a representation of an output state of each delay element of a second plurality of delay elements of the plurality of delay elements at the time the second edge is received at the latch.

7. The TDC of claim 1, wherein the latch circuit includes a plurality of latches, wherein each latch of the plurality of latches is coupled to an output of one of the delay elements of the plurality of delay elements, and wherein the output of the latch circuit includes an output of each latch of the plurality of latches.

8. The TDC of claim 1, wherein the latch circuit includes a high-resolution latch, the high resolution latch including a plurality of sub-latch circuits, the high resolution latch configured to receive an output of a single delay element of the plurality of delay elements and to provide a plurality of high-resolution outputs, wherein each sub-latch circuit of the plurality of sub-latch circuits includes a different latch delay.

9. The TDC of claim 1, including a recycle path configured to provide an output signal of a downstream delay element of the delay line to an upstream delay element of the delay line.

10. The TDC of claim 9, wherein the recycle path includes a buffer having a buffer input coupled to an output of the downstream delay element and a buffer output coupled to an input of the upstream delay element.

11. The TDC of claim 10, wherein the buffer includes an inverter.

12. A method of providing a digital representation of a time interval, the method comprising:
receiving a first signal at a multiplexer having a plurality of outputs, each output coupled to an input of a corresponding delay element of a plurality of sequentially connected delay elements of a delay line;
multiplexing the first signal to an input of a delay element of the plurality of sequentially connected delay elements via a corresponding output of the multiplexer based on prediction information received at a multiplexer;
propagating in a sequential manner the first edge of a first signal through a remaining plurality of sequentially connected delay elements of the plurality of sequentially connected delay elements;
latching a plurality of output states of the plurality of sequentially connected delay elements at a latch circuit upon reception of a second edge of a second signal at the latch circuit; and
providing an indication of a delay between the first edge and the second edge using an output of the latch circuit.

13. The method of claim 12, wherein the propagating in a sequential manner the first edge of a first signal through a remaining plurality of sequentially connected delay elements of the plurality of sequentially connected delay elements includes propagating the first edge sequentially through a coarse delay element having a coarse delay interval and through a fine delay element having a fine delay interval,
wherein the coarse delay interval has a duration that is at least twice as long as the fine delay interval.

14. The method claim 13, wherein the propagating the first edge sequentially through a coarse delay element having a coarse delay interval and through a fine delay element having a fine delay interval includes:
propagating the first edge through the coarse delay element to provide a first delayed representation of the first edge; and
propagating the first delayed representation of the first edge through the fine delay element.

15. The method of claim 13, receiving a second delayed representation of the first edge at a second fine delay element located at a distal end of the delay line;
propagating the second delayed representation of the first edge through the second fine delay element to provide a first cycle-delayed representation of the first edge; and
receiving the first cycle-delayed representation of the first edge at a first coarse delay element of the plurality of sequentially connected delay elements, the first coarse delay element located at a proximal end of the delay line.

16. The method of claim 12, wherein the latching includes latching outputs of a plurality of latches of the latch circuit, wherein each latch is coupled to an output of one of the delay elements of the plurality of sequentially connected delay elements.

17. The method of claim 16, wherein the latching includes latching a plurality of outputs of a high resolution latch, the high resolution latch coupled to an output of a second one of the delay elements of the plurality of sequentially connected delay elements.

18. The method of claim 12, wherein the propagating in a sequential manner the first edge of a first signal through a remaining plurality of sequentially connected delay elements of the plurality of sequentially connected delay elements includes recycling the first edge to an upstream delay element of the plurality of sequentially connected delay elements.

19. The method of claim 18, including buffering an output of a downstream delay element of the plurality of sequentially connected delay elements before the recycling of the first edge.

20. The method of claim 18, wherein the buffering an output of a downstream delay element includes inverting the output of the downstream delay element.

21. A communication device comprising:
a reference generator configured to provide reference frequency and phase information;
a digital-to-time converter (DTC) configured to receive the reference frequency and phase information, to receive phase modulation information from a baseband processor, and to provide a phase modulated signal; and
a time-to-digital converter (TDC) configured to provide compensation information for either the reference generator or the DTC, the TDC including:
a delay line including a plurality of delay elements configured to propagate a first edge of a first signal sequentially through the plurality of delay elements;
a selection circuit having a plurality of outputs, each output of the plurality of outputs individually coupled to an input of each delay element of the plurality of delay elements, the selection circuit configured to receive the first signal, to receive prediction information, and to route the first signal to an input of one of the plurality of delay elements via a corresponding, individually-coupled output of the plurality of outputs of the selection circuit based on the prediction information; and a latch circuit configured to receive a second signal and to latch a plurality of outputs of the delay line upon reception of a second edge of the second signal, wherein an output of the latch circuit provides an indication of a delay between the first edge and the second edge.

22. The communication device of claim 21, further comprising an amplifier configured to receive the phase modulated signal and a corresponding amplitude signal and to provide a radio frequency signal.

23. The communication device of claim 22, further comprising one or more antenna coupled to the amplifier.

24. The communication device of claim 23, further comprising a demodulator configured to receive a radio frequency signal from the antenna and the phase information and to provide a data signal representative of data demodulated from the radio signal using the phase information.

25. The communication device of claim 23, wherein the amplifier is configured for transmission of OFDMA signals, and wherein the transmitter is configured to operate as part of user equipment (UE).

* * * * *